United States Patent
Wang et al.

(10) Patent No.: US 9,105,464 B2
(45) Date of Patent: Aug. 11, 2015

(54) SEMICONDUCTOR STRUCTURE WITH RARE EARTH OXIDE

(71) Applicant: Tsinghua University, Beijing (CN)

(72) Inventors: Jing Wang, Beijing (CN); Renrong Liang, Beijing (CN); Lei Guo, Beijing (CN); Jun Xu, Beijing (CN)

(73) Assignee: Tsinghua University, Beijing (CN)

( * ) Notice: Subject to any disclaimer, the term of this patent is extended or adjusted under 35 U.S.C. 154(b) by 0 days.

(21) Appl. No.: 13/816,173

(22) PCT Filed: Dec. 18, 2012

(86) PCT No.: PCT/CN2012/086872
§ 371 (c)(1),
(2) Date: Feb. 8, 2013

(87) PCT Pub. No.: WO2014/059732
PCT Pub. Date: Apr. 24, 2014

(65) Prior Publication Data
US 2014/0145312 A1    May 29, 2014

(51) Int. Cl.
| | |
|---|---|
| *H01L 29/02* | (2006.01) |
| *H01L 21/02* | (2006.01) |
| *H01L 21/28* | (2006.01) |
| *H01L 29/51* | (2006.01) |
| *H01L 29/78* | (2006.01) |
| *H01L 29/10* | (2006.01) |
| *H01L 29/161* | (2006.01) |

(52) U.S. Cl.
CPC ............. *H01L 29/02* (2013.01); *H01L 21/0251* (2013.01); *H01L 21/02507* (2013.01); *H01L 21/28255* (2013.01); *H01L 29/1054* (2013.01); *H01L 29/161* (2013.01); *H01L 29/517* (2013.01); *H01L 29/78* (2013.01)

(58) Field of Classification Search
CPC .............. H01L 29/02; H01L 21/02507; H01L 21/0251; H01L 21/3142; H01L 21/3143; H01L 2924/01105; H01L 2924/01107; H01L 21/28255
USPC ............................................. 257/98, 632, 635
See application file for complete search history.

(56) References Cited

U.S. PATENT DOCUMENTS

2011/0220173 A1\* 9/2011 Lebby ........................... 136/246
2012/0104443 A1\* 5/2012 Clark et al. .................... 257/98

\* cited by examiner

*Primary Examiner* — Jose R Diaz
(74) *Attorney, Agent, or Firm* — Houtteman Law LLC

(57) ABSTRACT

A semiconductor structure with a rare earth oxide is provided. The semiconductor structure comprises: a semiconductor substrate (100); and a plurality of insulation oxide layers (201, 202 ... 20x) and a plurality of single crystal semiconductor layers (301, 302 ... 30x) alternately stacked on the semiconductor substrate (100). A material of the insulation oxide layer (201) contacted with the semiconductor substrate (100) is any one of a rare earth oxide, $SiO_2$, $SiO_xN_y$, and a combination thereof, a material of other insulation oxide layers (202 ... 20x) is a single crystal rare earth oxide.

14 Claims, 1 Drawing Sheet

SEMICONDUCTOR STRUCTURE WITH RARE EARTH OXIDE

CROSS-REFERENCE TO RELATED APPLICATION

This application claims priority to and benefits of Chinese Patent Application Serial No. 201210401766.1, filed with the State Intellectual Property Office of P. R. China on Oct. 19, 2012, the entire contents of which are incorporated herein by reference.

FIELD

The present disclosure relates to a semiconductor field, and more particularly to a semiconductor structure with a rare earth oxide.

BACKGROUND

In a semiconductor field, a three dimensional structure technology is becoming a focus in order to fabricate a highly integrated chip. For instance, a memory chip with a multi-layer stack structure is an important technical trend in high density storage. For a fabrication of a device with the multi-layer stack structure, according to one method, firstly a semiconductor structure with a plurality of insulation dielectric layers and a plurality of single crystal semiconductor layers alternately stacked is formed, and then a device is formed on the single crystal semiconductor layer.

However, the fabrication the semiconductor structure with a plurality of insulation dielectric layers and a plurality of single crystal semiconductor layers alternately stacked has not been well developed yet for decades. A main reason is that a common single crystal semiconductor material is difficult to lattice match with a conventional insulation dielectric material. A common method for forming a single crystal semiconductor film is an epitaxial growth. For the epitaxial growth of a high quality single crystal semiconductor film on the insulation dielectric, the insulation dielectric material may be required to not only have a single crystal structure, but also well lattice match with the single crystal semiconductor film. Taking a commonly used single crystal silicon as an example, most known insulation dielectric materials have an amorphous structure or lattice constant differences between these currently known insulation dielectric materials and silicon are large. For instance, although conventional insulation dielectric materials (such as $SiO_2$, $Si_3N_4$, $HfO_2$, $ZrO_2$ or $Al_2O_3$) may form single crystals, the lattice constant differences between them and the single crystal silicon are large. Many defects will be produced in the single crystal silicon film which is epitaxially grown on these single crystal dielectric layers, or even it is difficult to epitaxially grow the single crystal silicon film, thus resulting in a defective device formed on the single crystal silicon film.

In addition, with an increase of an integration density of semiconductor devices, heat dissipation will become a critical problem. Particularly, for a three dimensional logic device, a heat conductivity of an isolation dielectric filled between devices is required to be the larger the better so as to improve a performance of the logic device. However, the heat conductivity of a conventional insulation dielectric (such as $SiO_2$ or $SiO_xN_y$) is too poor to satisfy a heat dissipation requirement of a high density integrated semiconductor logic chip.

SUMMARY

The present disclosure is aimed to solve at least one of the problems, and particularly a semiconductor structure with a plurality of insulation dielectric layers and a plurality of single crystal semiconductor layers alternately stacked is provided. The semiconductor structure, which has advantages of a relative low crystal defect density and a relative large heat conductivity of an isolation dielectric, is used for fabricating a three dimensional semiconductor device with high performance and high integration density, and can satisfy a heat dissipation requirement of a high density semiconductor device.

According to an aspect of the present disclosure, a semiconductor structure with a rare earth oxide is provided. The semiconductor structure comprises: a semiconductor substrate; and a plurality of insulation oxide layers and a plurality of single crystal semiconductor layers alternately stacked on the semiconductor substrate, in which a material of the insulation oxide layer contacted with the semiconductor substrate is any one of a rare earth oxide, $SiO_2$, $SiO_xN_y$ and a combination thereof, a material of other insulation oxide layers is a single crystal rare earth oxide.

In one embodiment, a material of the semiconductor substrate comprises single crystal Si, single crystal SiGe and single crystal Ge.

In one embodiment, a thickness of each insulation oxide layer is not less than 50 nm.

In one embodiment, a material of each insulation oxide layer comprises any one of $(Gd_{1-x}Er_x)_2O_3$, $(Gd_{1-x}Nd_x)_2O_3$, $(Er_{1-x}Nd_x)_2O_3$, $(Pr_{1-x}La_x)_2O_3$, $(Pr_{1-x}Nd_x)O_3$, $(Pr_{1-x}Gd_x)_2O_3$, $(Er_{1-x}La_x)_2O_3$ and a combination thereof, where x is within a range from 0 to 1. Because within rare earth elements, most actinide elements are radioactive and hence are rarely applied, lanthanide element oxide is mostly used as the rare earth oxide. Both a rare earth oxide crystal and a conventional semiconductor material (such as Si, Ge, SiGe or GaAs) belong to a cubic system, and lattice constants of rare earth oxide crystals (such as $La_2O_3$, $Pr_2O_3$, $Nd_2O_3$, $Er_2O_3$ or $Gd_2O_3$) of different lanthanide elements are approximately the same, which are about twice of that of Si or Ge crystal, that is, one unit cell of the rare earth oxide crystal just matches with two unit cells of Si or Ge crystal. Thus the rare earth oxide crystal and Si or Ge crystal substantially lattice match with each other, which is helpful to form the semiconductor film on the rare earth oxide by epitaxial growth, and also to form the rare earth oxide on the semiconductor film by epitaxial growth.

In one embodiment, a material of each single crystal semiconductor layer comprises any one of Si, Ge, SiGe, group III-V compound semiconductor materials, and group II-VI compound semiconductor materials and a combination thereof In one embodiment, each single crystal semiconductor layer comprises one or more sub-layers.

In one embodiment, each insulation oxide layer comprises one or more sub-layers.

In one embodiment, at least one single crystal semiconductor layer is different from other single crystal semiconductor layers in material.

In one embodiment, at least one insulation oxide layer is different from other insulation oxide layers in material.

In one embodiment, at least one single crystal semiconductor layer is strained.

In one embodiment, at least one single crystal semiconductor layer is different from other single crystal semiconductor layers in degree of strain.

In one embodiment, at least one single crystal semiconductor layer is different from other single crystal semiconductor layers in type of strain.

In one embodiment, a surface of the semiconductor substrate is any crystal plane of (100), (110) and (111).

In one embodiment, the surface of the semiconductor substrate is the crystal plane of (100), and a surface of each single crystal semiconductor layer is the crystal plane of (110).

In one embodiment, each insulation oxide layer with the material of rare earth oxide and each single crystal semiconductor layer are formed by epitaxial growth.

The semiconductor structure with the rare earth oxide according to embodiment of the present disclosure at least has following advantages.

(1) The semiconductor structure with a plurality of insulation dielectric layers and a plurality of single crystal semiconductor layers alternately stacked is used for fabricating the three dimensional semiconductor device with high integration density to greatly increase an integration density of the device, and also to realize a three dimensional integration with different devices.

(2) The semiconductor structure may be formed by alternately epitaxially growing the semiconductor layer and the rare earth oxide. Because the single crystal semiconductor and the single crystal rare earth lattice match with each other, a crystal defect in the semiconductor structure may be obviously reduced, which is favorable for a formation of high performance semiconductor devices on the semiconductor structure.

(3) By adjusting the element type and content of the rare earth oxide, the lattice constant thereof is adjusted accordingly. For instance, the lattice constant of $La_2O_3$ is slightly more than twice of that of Ge, the lattice constants of $Er_2O_3$ and $Gd_2O_3$ are slightly smaller than that of twice of Si, and the lattice constants of $Pr_2O_3$ and $Nd_2O_3$ are between twice of that of Si and Ge. By adjusting the element (such as La or Er) content of the rare earth oxide, the lattice constant thereof may be slightly more than, slightly smaller than or equivalent to that of semiconductor crystal (such as Si, Ge, SiGe or GaAs) so as to control the type and degree of strain of the single crystal semiconductor film epitaxially grown on the single crystal rare earth oxide, that is, the single crystal semiconductor film with a tensile stress or a compressive stress and with different stress degrees may be epitaxially grown on the single crystal rare earth oxide.

(4) The heat conductivity of the single crystal rare earth oxide is larger than that of a conventional oxide (such as $SiO_2$ or SiON). For instance, the heat conductivity of the single crystal rare earth oxide is more than three times of that of the thermal growth dielectric $SiO_2$, thus evidently improving the heat dissipation of devices and enhancing a device performance accordingly.

(5) Although a dielectric constant of the rare earth oxide is higher than that of $SiO_2$ and $SiO_xN_y$, the rare earth oxide has an excellent insulation property, and thus can be used as an insulation dielectric between two layers of semiconductor devices. In this case, a relative thicker rare earth oxide layer may be formed between the two layers of semiconductor devices to avoid an influence of high dielectric constant.

(6) A conventional epitaxy process (such as MOCVD (metal-organic chemical vapor deposition), SSE (solid source epitaxy), UHVCVD (ultra-high vacuum chemical vapor deposition) or MBE (molecular beam epitaxy)) may be introduced to fabricate the semiconductor structure. These fabrication processes are compatible with conventional semiconductor fabrication processes, and simple to realize with low cost.

Additional aspects and advantages of the embodiments of the present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of the disclosure will become apparent and more readily appreciated from the following descriptions taken in conjunction with the drawings in which.

DETAILED DESCRIPTION

Figure 1:
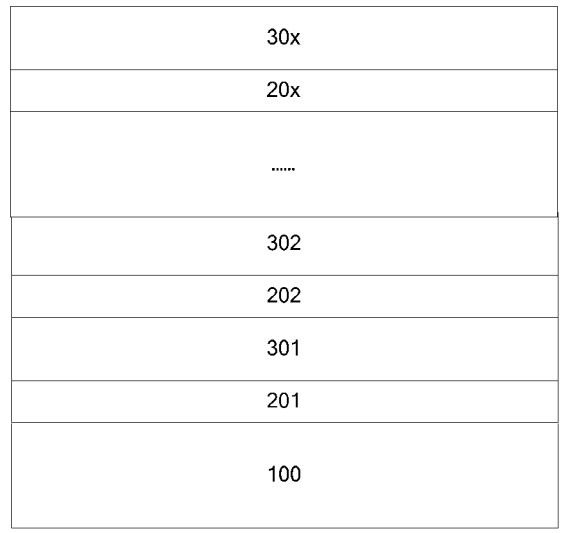
FIG. 1 is a cross-sectional view of a semiconductor structure with a rare earth oxide according to an embodiment of the present disclosure.

Embodiments of the present disclosure will be described in detail in the following descriptions, examples of which are shown in the accompanying drawings, in which the same or similar elements and elements having same or similar functions are denoted by like reference numerals throughout the descriptions. The embodiments described herein with reference to the accompanying drawings are explanatory and illustrative, which are used to generally understand the present disclosure. The embodiments shall not be construed to limit the present disclosure.

It is to be understood that phraseology and terminology used herein with reference to device or element orientation (such as, terms like "longitudinal", "lateral", "front", "rear", "right", "left", "lower", "upper", "horizontal", "vertical", "above", "below", "up", "top", "bottom" as well as derivative thereof such as "horizontally", "downwardly", "upwardly", etc.) are only used to simplify description of the present invention, and do not alone indicate or imply that the device or element referred to must have or operated in a particular orientation, and thus do not be construed to limit the present disclosure. Furthermore, except as otherwise indicated, "a plurality of" means two or more.

FIG. 1 is a cross-sectional view of a semiconductor structure with a rare earth oxide according to an embodiment of the present disclosure. As shown in FIG. 1, the semiconductor structure comprises: a semiconductor substrate 100; and a plurality of insulation oxide layers 201, 202 . . . 20x and a plurality of single crystal semiconductor layers 301, 302 . . . 30x alternately stacked on the semiconductor substrate 100. A material of the insulation oxide layer 201 contacted with the semiconductor substrate 100 is any one of a rare earth oxide, $SiO_2$, $SiO_xN_y$, and a combination thereof, a material of other insulation oxide layers (from 202 to 20x) is a single crystal rare earth oxide. For a formation of a three dimensional device structure to increase an integration density, two or more layers of single crystal semiconductor layers are preferred. By forming a rare earth oxide layer on the semiconductor layer, because the single crystal semiconductor and the single crystal rare earth oxide lattice match with each other, a crystal defect in the semiconductor structure may be obviously reduced, which is favorable for the formation of high performance semiconductor devices on the semiconductor structure.

In one embodiment, a material of the semiconductor substrate 100 may comprise single crystal Si, single crystal SiGe and single crystal Ge.

In one embodiment, the material of the insulation oxide layer 201 contacted with the semiconductor substrate 100 may be any one of rare earth oxide, $SiO_2$, $SiO_xN_y$, and a combination thereof in a single-crystal or amorphous state, so as to form a SOI (semiconductor-on-insulator) structure with the semiconductor substrate 100, the insulation oxide layer 201 and the single crystal semiconductor layer 301. The material of insulation oxide layers 202 . . . 20x is the single crystal rare earth oxide. Specifically, the rare earth oxide may comprise any one of $(Gd_{1-x}Er_x)_2O_3$, $(Gd_{1-x}Nd_x)_2O_3$, $(Er_{1-x}Nd_x)_2O_3$, $(Pr_{1-x}La_x)_2O_3$, $(Pr_{1-x}Nd_x)_2O_3$, $(Pr_{1-x}Gd_x)_2O_3$, $(Er_{1-x}La_x)_2O_3$ and a combination thereof, where x is within a range from 0 to 1. Because within rare earth elements, most actinide elements are radioactive and hence are rarely applied, lanthanide element oxide is mostly used as the rare earth oxide. Both a rare earth oxide crystal and a conventional semiconductor material (such as Si, Ge, SiGe or GaAs) belong to a cubic system, and lattice constants of lanthanide elements rare earth oxide crystals (such as $La_2O_3$, $Pr_2O_3$, $Nd_2O_3$, $Er_2O_3$ or $Gd_2O_3$) are approximately the same, which are about twice of that of Si or Ge crystal, that is, one unit cell of the rare earth oxide crystal just matches with two unit cells of Si or Ge crystal. Thus the rare earth oxide crystal and Si or Ge crystal substantially lattice match with each other, which is helpful to form the semiconductor film on the rare earth oxide by epitaxial growth, and also to form the rare earth oxide on the semiconductor film by epitaxial growth. It should be noted that in order to ensure an insulation property of the rare earth oxide layers and to avoid an influence of high dielectric constant thereof, a thickness of each insulation oxide layer is not less than 50 nm. Preferably, the thickness of each rare earth oxide layer is not less than 500 nm. In addition, each insulation oxide layer may comprise one or more sub-layers. Each insulation oxide layer may be identical in material, or at least one insulation oxide layer may be different from other insulation oxide layers in material.

The material of single crystal semiconductor layers 301, 302 . . . 30x may comprise any one of Si, Ge, SiGe, group III-V compound semiconductor materials, and group II-VI compound semiconductor materials and a combination thereof It should be noted that, each single crystal semiconductor layer may comprise one or more sub-layers (such as quantum well structures Si/SiGe/Si or AlGaAs/InGaAs/AlGaAs). Each single crystal semiconductor layer may be identical in material, or at least one single crystal semiconductor layer is different from other single crystal semiconductor layers in material.

In a preferred embodiment, the material of the insulation oxide layer 201 is single crystal rare earth oxide, and the insulation oxide layers 201, 202 . . . 20x and the single crystal semiconductor layers 301, 302 . . . 30x may be formed by epitaxial growth so as to obtain high quality and low defect oxide films and semiconductor films. For instance, with the rare earth element and $O_2$ as reaction precursors, the rare earth oxide is grown by solid source epitaxy (SSE) in a vacuum of $10^{-5}$-$10^{-12}$ Torr and at a temperature of 600-1200° C. for 60 minutes. The rare earth oxide film with a thickness of 500 nm is formed. In another embodiment, the insulation oxide layers 201, 202 . . . 20x and the single crystal semiconductor layers 301, 302 . . . 30x may be formed by a conventional deposition method (such as an ultra-high vacuum chemical vapor deposition (UHVCVD), a metal-organic chemical vapor deposition (MOCVD), a physical vapor deposition (PVD) or a molecular beam epitaxy (MBE)).

In one embodiment, a surface of the semiconductor substrate 100 may be a crystal plane of (100), (110) or (111). When each insulation oxide layer and the semiconductor substrate 100 have a same surface crystal plane index, a surface crystal plane index of each single crystal semiconductor layer may be identical to that of the semiconductor substrate 100. For instance, when the surface crystal plane index of the semiconductor substrate 100 is (100), the surface crystal plane index of each insulation oxide layer may be (100), and accordingly, the surface crystal plane index of each single crystal semiconductor layer may be also (100). In one embodiment, by using Si with the surface crystal plane of (100) as the semiconductor substrate 100, the rare earth oxide $(Gd_{1-x}Nd_x)_2O_3$ with the surface crystal plane of (100) and the semiconductor layer of single crystal Si with the surface crystal plane of (100) are alternately epitaxially grown on the semiconductor substrate 100. Furthermore, by adjusting the content of Nd in $(Gd_{1-x}Nd_x)_2O_3$, the lattice constant thereof may be twice of that of Si, so as to form the semiconductor structure of alternate high quality insulation oxide layer and semiconductor layer of single crystal Si, which is useful for fabricating a three dimensional NAND flash device.

Figure 2:
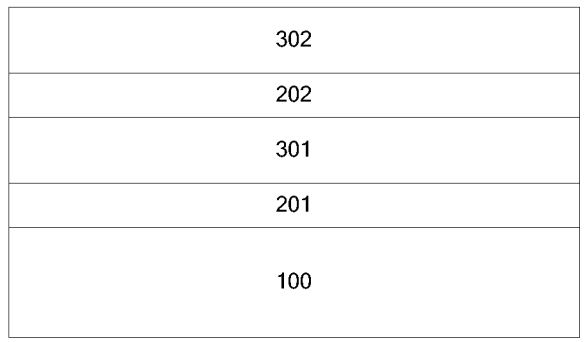
FIG. 2 is a cross-sectional view of a semiconductor structure with a rare earth oxide according to another embodiment of the present disclosure.

In one embodiment, because there is the insulation oxide layer between the single crystal semiconductor layer and the semiconductor substrate 100, the surface crystal plane index of the single crystal semiconductor layer may be the same with or different from that of the semiconductor substrate 100. An oxygen bond in the rare earth oxide may be used as a mediated template to coordinate crystal indices of the semiconductor substrate 100 and the rare earth oxide layer, thus realizing a crystal index transformation. For instance, when the surface crystal plane index of the semiconductor substrate is (100), because of an adjustment of oxygen bond as a mediated template, a crystal plane reconstruction may occur to grow the rare earth oxide layer with the surface crystal plane of (110), and then the single crystal semiconductor layer with the surface crystal plane of (110) may be formed on the rare earth oxide layer with the surface crystal plane of (110) by epitaxial growth, thus realizing the crystal index transformation. As shown in FIG. 2, the semiconductor structure according to this embodiment from bottom to up comprises: a semiconductor substrate 100 (single crystal Si with the crystal plane of (100)); a first insulation oxide layer 201 $((Pr_{1-x}La_x)_2O_3$ (0≤x≤1) (such as $La_2O_3$) with the crystal plane of (110)); a first single crystal semiconductor layer 301 (single crystal Ge with the crystal plane of (110)); a second insulation oxide layer 202 $((Pr_{1-x}La_x)_2O_3$ (0≤x≤1) (such as $La_2O_3$) with the crystal plane of (110)); and a second single crystal semiconductor layer 302 (single crystal Ge with the crystal plane of (110)).

In one embodiment, single crystal semiconductor layers with different crystal indices may be formed in different regions of one substrate. For instance, rare earth oxide layers with the surface crystal plane of (100) and single crystal semiconductor layers with the surface crystal plane of (100) are alternately formed on a partial region of a Si substrate with the surface crystal plane of (100) which is used for fabricating a NMOSFET device, while rare earth oxide layers with the surface crystal plane of (110) and single crystal semiconductor layers with the surface crystal plane of (110) are alternately formed on another partial region of the Si substrate which is used for fabricating a PMOSFET device, since a hole mobility of Si with the crystal orientation of (110)/<110> is more than twice of that of Si with the crystal orientation of (100)/<110>.

In a preferred embodiment, each single crystal semiconductor layer may be strained. By adjusting the element type and content of the rare earth oxide, the lattice constant thereof is adjusted accordingly. For instance, the lattice constant of $La_2O_3$ is slightly more than twice of that of Ge, the lattice constants of $Er_2O_3$ and $Gd_2O_3$ are slightly smaller than twice of that of Si, and the lattice constants of $Pr_2O_3$ and $Nd_2O_3$ are between twice of that of Si and twice of that of Ge. By adjusting the element (such as La or Er) content of the rare earth oxide, the lattice constant thereof may be slightly larger than, slightly smaller than or equivalent to that of semiconductor crystal (such as Si, Ge, SiGe or GaAs). Accordingly, the single crystal semiconductor film grown on the rare earth oxide layer may be tensilely strained, compressively strained or non-strained so as to control the type and degree of strain of the single crystal semiconductor film epitaxially grown on the single crystal rare earth oxide. The strained semiconductor layer is helpful to improve a carrier mobility of a channel. For instance, the tensile stress is helpful to increase an electron mobility for the NMOSFET, while the compressive stress is helpful to increase the hole mobility for the PMOSFET. Furthermore, in another embodiment, at least one single crystal semiconductor layer is different from other single crystal semiconductor layers in type of strain, in which the tensilely strained single crystal semiconductor layer may be used for fabricating the NMOSFET, and the compressively strained single crystal semiconductor layer may be used for fabricating the PMOSFET. In another embodiment, at least one single crystal semiconductor layer is different from other single crystal semiconductor layers in degree of strain, in which the lowly strained single crystal semiconductor layer may be used for fabricating a memory device, and due to a high carrier mobility, the highly strained single crystal semiconductor layer may be used for fabricating a logic device.

Figure 3:
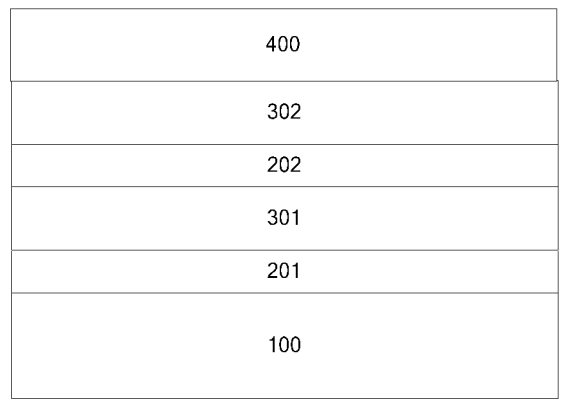
FIG. 3 is a cross-sectional view of a semiconductor structure with a rare earth oxide according to another embodiment of the present disclosure.

For a better explanation of an application of the strained single crystal semiconductor layer according to an embodiment of the present disclosure, a further example is described as follows. As shown in FIG. 3, the semiconductor structure according to this embodiment from bottom to up comprises: a semiconductor substrate 100; a first insulation oxide layer 201; a first single crystal semiconductor layer 301; a second insulation oxide layer 202; a second single crystal semiconductor layer 302; and an up passivation layer 400. A material of the semiconductor substrate 100 is Si with the surface crystal plane of (100), and a material of the surface passivation layer 400 is Si or nitride, etc, depending on a material of the second single crystal semiconductor layer 302.

In one embodiment, materials of the first insulation oxide layer 201 and the second insulation oxide layer 202 are $(Er_{1-x}La_x)_2O_3$ ($0 \le x \le 1$), whose lattice constant matches with that of the substrate 100 (the lattice constant of $(Er_{1-x}La_x)_2O_3$ is twice of that of Si), a material of the first single crystal semiconductor layer 301 is strained $Si_{1-y}C_y$ ($0 \le y \le 1$, where C is a substitution atom rather than an interstitial atom), a material of the second single crystal semiconductor layer 302 is strained $Si_{1-y}Ge_y$ ($0 \le y \le 1$), and the material of the surface passivation layer 400 is Si to enable the material surface stable. In this embodiment, because an atomic radius of C is smaller than that of Si, and an atomic radius of Ge is bigger than that of Si, the first single crystal semiconductor layer 301 (strained $Si_{1-y}C_y$ layer) is tensilely strained and has a high electron mobility for fabricating NMOSFET devices, and the second single crystal semiconductor layer 302 (strained $Si_{1-y}Ge_y$ layer) is compressively strained and has a high hole mobility for fabricating PMOSFET devices, that is, two single crystal semiconductor layers with different types of strain are used for fabricating different types of devices.

In another embodiment, materials of the first insulation oxide layer 201 and the second insulation oxide layer 202 are $(Er_{1-x}La_x)_2O_3$ ($0 \le x \le 1$), whose lattice constant matches with that of the substrate 100 (the lattice constant of $(Er_{1-x}La_x)_2O_3$ is twice of that of Si), a material of the first single crystal semiconductor layer 301 is Si, a material of the second single crystal semiconductor layer 302 is strained $Si_{1-y}Ge_y$ ($0 \le y \le 1$), and the material of the surface passivation layer 400 is Si to enable the material surface stable. In this embodiment, because an atomic radius of Ge is bigger than that of Si, the first single crystal semiconductor layer 301 (Si layer) is not strained, and the second single crystal semiconductor layer 302 (strained $Si_{1-y}Ge_y$ layer) is compressively strained, that is, two single crystal semiconductor layers have different strains. The non-strained first single crystal semiconductor layer 301 (Si layer) may be used for fabricating NMOSFET devices, and the compressively strained second single crystal semiconductor layer 302 (strained $Si_{1-y}Ge_y$ layer) may be used for fabricating PMOSFET devices.

In another embodiment, materials of the first insulation oxide layer 201 and the second insulation oxide layer 202 are $(Er_{1-x}La_x)_2O_3$ ($0 \le x \le 1$) but with different x. La content in the first insulation oxide layer 201 is relatively low, while La content in the second insulation oxide layer 202 is relatively high so that the lattice constant of the first insulation oxide layer 201 is less than that of the second insulation oxide layer 202. The lattice constant of the first insulation oxide layer 201 which is twice of that of Si matches with that of Si, and the lattice constant of the second insulation oxide layer 202 which is twice of that of Ge matches with that of Ge. A material of the first single crystal semiconductor layer 301 is relaxation Si, a material of the second single crystal semiconductor layer 302 is relaxation Ge, and the material of the surface passivation layer 400 is amorphous $Si_3N_4$ to enable the material surface stable. In this embodiment, by adjusting the rare earth element content in each insulation oxide layer, the lattice constant thereof is adjusted so that either the first single crystal semiconductor layer 301 or the second single crystal semiconductor layer 302 is substantially not strained. In this aspect, it is helpful to control the degree of strain of each single crystal semiconductor layer, thus obtaining the high quality single crystal semiconductor layers. The second single crystal semiconductor layer 302 (Ge layer) may be used for fabricating a Ge detector, and the first single crystal semiconductor layer 301 (Si layer) may be used for fabricating a MOSFET device which may form a control circuit for controlling the Ge detector so as to realize a three dimensional integration of the Ge detector and the control circuit.

The semiconductor structure with the rare earth oxide is provided according to embodiments of the present disclosure. By alternately stacking the plurality of insulation dielectric layers and the plurality of single crystal semiconductor layers, because the single crystal semiconductor and the single crystal rare earth lattice match with each other, the crystal defect in the semiconductor structure may be obviously reduced, which is favorable for a formation of high performance and high density three dimensional semiconductor devices on the semiconductor structure. It is not only to greatly increase the integration density of the device, but also to realize the three dimensional integration with different devices. Moreover, because the heat conductivity of the single crystal rare earth oxide is larger than that of the conventional oxide (such as $SiO_2$ or $SiO_xN_y$), the heat dissipation between devices can be evidently improved and the device performance can be enhanced accordingly. In addition, processes for fabricating the semiconductor structure are compatible with conventional semiconductor fabrication processes, and simple to realize with low cost.

Reference throughout this specification to "an embodiment", "some embodiments", "one embodiment", "an example", "a specific example", or "some examples" means that a particular feature, structure, material, or characteristic described in connection with the embodiment or example is included in at least one embodiment or example of the disclosure. Thus, the appearances of the phrases such as "in some embodiments", "in one embodiment", "in an embodiment", "in an example", "in a specific example", or "in some examples" in various places throughout this specification are not necessarily referring to the same embodiment or example of the disclosure. Furthermore, the particular features, structures, materials, or characteristics may be combined in any suitable manner in one or more embodiments or examples.

Although explanatory embodiments have been shown and described, it would be appreciated by those skilled in the art that changes, alternatives, and modifications may be made in the embodiments without departing from spirit and principles of the disclosure. Such changes, alternatives, and modifications all fall into the scope of the claims and their equivalents.

What is claimed is:

1. A semiconductor structure with a rare earth oxide, comprising:
   a semiconductor substrate; and
   a plurality of insulation oxide layers and a plurality of single crystal semiconductor layers alternately stacked on the semiconductor substrate,
   wherein a material of the insulation oxide layer contacted with the semiconductor substrate is any one of a rare earth oxide, $SiO_2$, $SiO_xN_y$, and a combination thereof, a material of other insulation oxide layers is a single crystal rare earth oxide, each single crystal semiconductor layer comprises at least two sub-layers.

2. The semiconductor structure according to claim 1, wherein a material of the semiconductor substrate comprises single crystal Si, single crystal SiGe and single crystal Ge.

3. The semiconductor structure according to claim 1, wherein a thickness of each insulation oxide layer is not less than 50 nm.

4. The semiconductor structure according to claim 1, wherein a material of each insulation oxide layer comprises any one of $(Gd_{1-x}Er_x)_2O_3$, $(Gd_{1-x}Nd_x)_2O_3$, $(Er_{1-x}Nd_x)_2O_3$, $(Pr_{1-x}La_x)_2O_3$, $(Pr_{1-x}Nd_x)_2O_3$, $(Pr_{1-x}Gd_x)_2O_3$, $(Er_{1-x}La_x)_2O_3$ and a combination thereof, where x is within a range from 0 to 1.

5. The semiconductor structure according to claim 1, wherein a material of each single crystal semiconductor layer comprises any one of Si, Ge, SiGe, group III-V compound semiconductor materials, and group II-VI compound semiconductor materials and a combination thereof.

6. The semiconductor structure according to claim 1, wherein each insulation oxide layer comprises one or more sub-layers.

7. The semiconductor structure according to claim 1, wherein at least one single crystal semiconductor layer is different from other single crystal semiconductor layers in material.

8. The semiconductor structure according to claim 1, wherein at least one insulation oxide layer is different from other insulation oxide layers in material.

9. The semiconductor structure according to claim 1, wherein at least one single crystal semiconductor layer is strained.

10. The semiconductor structure according to claim 9, wherein at least one single crystal semiconductor layer is different from other single crystal semiconductor layers in degree of strain.

11. The semiconductor structure according to claim 9, wherein at least one single crystal semiconductor layer is different from other single crystal semiconductor layers in type of strain.

12. The semiconductor structure according to claim 1, wherein a surface of the semiconductor substrate is any crystal plane of (100), (110) and (111).

13. The semiconductor structure according to claim 12, wherein the surface of the semiconductor substrate is the crystal plane of (100), and a surface of each single crystal semiconductor layer is the crystal plane of (110).

14. The semiconductor structure according to claim 1, wherein each insulation oxide layer with the material of rare earth oxide and each single crystal semiconductor layer are formed by epitaxial growth.

* * * * *